United States Patent [19]

Teramoto

[11] Patent Number: 5,602,856
[45] Date of Patent: Feb. 11, 1997

[54] TEST PATTERN GENERATION FOR LOGIC CIRCUITS WITH REDUCED BACKTRACKING OPERATIONS

[75] Inventor: Mitsuo Teramoto, Kanagawaken, Japan

[73] Assignee: Nippon Telegraph and Telephone Corporation, Tokyo, Japan

[21] Appl. No.: 223,173

[22] Filed: Apr. 5, 1994

[30] Foreign Application Priority Data

Apr. 6, 1993 [JP] Japan .................................. 5-079424

[51] Int. Cl.⁶ ..................................................... G06F 11/00
[52] U.S. Cl. ........................................ 371/27; 395/183.06
[58] Field of Search .......................... 371/27, 22.1, 22.3, 371/25.1; 395/183.06, 183.08

[56] References Cited

U.S. PATENT DOCUMENTS

| | | | |
|---|---|---|---|
| 3,961,250 | 6/1976 | Snethen | 324/73 |
| 4,204,633 | 5/1980 | Goel . | |
| 5,410,552 | 4/1995 | Hosokawa | 371/27 |

OTHER PUBLICATIONS

Article entitled, On The Acceleration of Test Generation Algorithms, by Hideo Fujiwara from IEEE Transactions on Computers, vol. C–32 No. 12 dated Dec. 12, 1983; and Article entitled, An Implicit Enumeration Alogorithm to Generate Tests for Combinational Logic Circuits by Prabhakar Goel and dated Mar. 1981 from IEEE Transactions on Computers, vol. C–30, No. 3.

*Primary Examiner*—Vincent P. Canney
*Attorney, Agent, or Firm*—Banner & Witcoff, Ltd.

[57] ABSTRACT

A scheme for generating test patterns for logic circuits which can generate the test patterns effectively and efficiently by making the assignments of the fewer logic values at earlier stages, so as to reduce the number of backtracking operations required. A test pattern for a logic circuit given by primary input logic values for setting a logic value of a specified signal line within the logic circuit at a specified level is generated by: checking whether a fault can be propagated to the specified signal line or not; deriving other signal lines whose logic values are uniquely determinable from the specified level of the specified signal line, only when it is judged that the fault cannot be propagated to the specified signal line; judging whether the primary inputs are contained among the derived other signal lines; and making an assignment of the specified level to the specified signal line, and setting the uniquely determinable logic values for those of the other signal lines which are judged as the primary inputs as the primary input logic values giving the test pattern.

7 Claims, 8 Drawing Sheets

FIG.6

| | | | |
|---|---|---|---|
| | | | |
| | | | |
| | | | |
| | | | |
| | | | |
| | | | |
| | | | |
| 5 | SIGNAL C | 0 | POSSIBLE |
| 4 | SIGNAL L | 0 | IMPOSSIBLE |
| 3 | SIGNAL Z | 1 | POSSIBLE |
| 2 | SIGNAL W | 1 | POSSIBLE |
| 1 | SIGNAL Y | 0 | POSSIBLE |

ORDER OF DECISION / SIGNAL LINE / DECIDED LOGIC VALUE / REMAINING/NO REMAINING ALTERNATIVE FLAG

FIG.8

| | | |
|---|---|---|
| | | |
| | | |
| | | |
| | | |
| | | |
| | | |
| | | |
| | | |
| | | |
| | | |
| SIGNAL3 | 2 | 1 |
| SIGNAL2 | 2 | 0 |
| SIGNAL1 | 0 | 1 |

SIGNAL LINE / NUMBER OF REQUESTS FOR LOGIC VALUE 1 / NUMBER OF REQUESTS FOR LOGIC VALUE 0

FIG.7

| LOGIC GATE | NUMBER OF REQUESTS FOR LOGIC VALUE 1 FOR INPUT SIGNAL : A(1) | NUMBER OF REQUESTS FOR LOGIC VALUE 0 FOR INPUT SIGNAL : A(0) |
|---|---|---|
| AND | FOR ALL INPUTS WITH VARIABLE VALUES  Ai(1)=Y(1) | FOR AN INPUT j WITH VARIABLE VALUE  Aj(0)=Y(0) |
| NAND | FOR ALL INPUTS WITH VARIABLE VALUES  Ai(1)=Y(0) | FOR AN INPUT j WITH VARIABLE VALUE  Aj(0)=Y(1) |
| OR | FOR AN INPUT j WITH VARIABLE VALUE  Aj(1)=Y(1) | FOR ALL INPUTS WITH VARIABLE VALUES  Ai(0)=Y(0) |
| NOR | FOR AN INPUT j WITH VARIABLE VALUE  Aj(1)=Y(0) | FOR ALL INPUTS WITH VARIABLE VALUES  Ai(0)=Y(1) |
| NOT | A(1)=Y(0) | A(0)=Y(1) |
| DELAY | A(1)=Y(1) | A(0)=Y(0) |

Y(0) : NUMBER OF REQUESTS FOR LOGIC VALUE 0 FOR OUTPUT SIGNAL

Y(1) : NUMBER OF REQUESTS FOR LOGIC VALUE 1 FOR OUTPUT SIGNAL

TEST PATTERN GENERATION FOR LOGIC CIRCUITS WITH REDUCED BACKTRACKING OPERATIONS

BACKGROUND OF THE INVENTION

1. Field of the Invention

The present invention relates to a scheme for generating test patterns for logic circuits specifying primary input logic values for examining logic circuits.

2. Description of the Background Art

The conventionally widely used test pattern generation method is for detecting the so called stuck fault in which a logic value of a signal line within a circuit is going to be fixed to 0 or 1. In order to detect such a stuck fault, there is a need to derive the primary input logic values such that the primary output logic values differ for a case of the presence of the fault and a case of the absence of the fault.

In order to derive such primary input logic values, it is necessary to set up the logic value opposite to that in a case of the fault with respect to the signal line with the fault in such a manner that the change of the signal values can be propagated through at least one path from the signal line with the fault to the primary output. In other words, the generation of the test patterns is effectively the problem of controlling the primary inputs such that the signal lines within the circuit and their logic values can be set appropriately according to the target fault.

The representative conventional test pattern generation methods includes the following:

[Ref. 1] U.S. Pat. No. 4,204,633 (May 27, 1980)

[Ref. 2] P. Goel, "An implicit Enumeration Algorithm to Generate Tests for Combinational Logic Circuits", IEEE Trans. on Computers, Vol. C-20, No. 3, pp. 215–222, March, 1981;

[Ref. 3] H. Fujiwara and T. Shimono, "On the Acceleration of Test Generation Algorithms", IEEE Trans. on Computers, Vol. C-32, No. 12, pp. 1137–1144, December, 1983.

In the following, the conventional test pattern generation method will be explained according to the teaching disclosed in [Ref. 1].

FIG. 1 shows a schematic configuration of a test pattern generation system for realizing the conventional Test pattern generation method. In this conventional test pattern generation system of FIG. 1, an object generation unit 10 generates an object, i.e., a set of a signal line and a logic value to be set to that signal line, which is required in generating the test pattern for each fault.

Then, a backtrace operation unit 8 propagates the generated object to the input side by carrying out the backtrace operation in which the new object is generated at the input side of each logic gate to which the generated object has propagated according to the function of that logic gate, so as to satisfy the generated object.

A decision making unit 9 judges whether the object has reached to the primary input or not. In a case the object has not reached the primary input, the operation returns to the object generation unit 10 which generates another object. On the other hand, in a case the object has reached the primary input, the decision making unit 9 decides the assignment of the logic value at the primary input.

Then, a conflict determination unit 11 determines whether the incorrect decision has been made by the decision making unit 9 or not. In a case the incorrect decision has been made, a backtracking unit 12 carries out the operation called backtracking in which the decision making is carried out anew.

Finally, a test pattern judgement unit 13 judges whether the test pattern has been obtained or not by checking whether there is a difference in the primary output logic value for the normal circuit and the circuit with fault. If it is judged that the test pattern has been obtained, the logic value assigned to the primary input is outputted as the appropriate test pattern, whereas otherwise the operation returns to the object generation unit 10 to repeat the above process for the next object.

More specifically, the operation to obtain the primary input logic value from the object in this conventional system proceeds according to the flow chart of FIG. 2 as follows.

Namely, whether the object is the primary input or not is determined at the step 21. In a case the signal line of the object is the primary input, the logic value is going to be assigned to the primary input according to the level of that object at the step 22. On the other hand, in a case the signal line of the object is not the primary input, the type of the logic gate which is driving the signal line and the level of the current object are determined at the step 23.

Then, a new object is generated with respect to the input of the logic gate according to the determined type of the logic gate and level of the current object as follows.

First, in a case the driving logic gate is OR/NAND and the level is 0, or the driving logic gate is AND/NOR and the level is 1, next at the step 24, the signal line of a new object to be generated is set to be one input signal line of the driving logic gate which is hardest to control from the primary input among those input signal lines having the variable values. On the other hand, in a case the driving logic gate is OR/NAND and the level is 1, or the driving logic gate is AND/NOR and the level is 0, next at the step 25, the signal line of a new object to be generated is set to be one input signal line of the driving logic gate which is easiest to control from the primary input among those input signal lines having the variable values.

Next, the type of the driving logic gate is determined at the step 26. Then, when the driving logic gate is AND/OR, next at the step 27, the level of a new object to be generated is set to be the level of the current object. On the other hand, when the driving logic gate is NAND/NOR, next at the step 28, the level of a new object to be generated is set to be an opposite value of the level of the current object.

The object can be propagated up to the primary input by executing the operation of the steps 21 to 28 for each object sequentially.

As a concrete illustrative example, for an exemplary circuit shown in FIG. 3, the test pattern generation according to the conventional method of [Ref. 1] proceeds as follows. Here, in the circuit of FIG. 3, the stuck at 0 fault is assumed to be present at the signal line I.

In this case, according to the conventional method of [Ref. 1], the object (I, 1) for setting the level 1 to the signal line I with the fault is generated first. Then, as the driving logic gate of this signal line I is NAND, the next object (B, 0) is generated according to the flow chart of FIG. 2. Also, the signal line B is the primary input, so that the logic value 0 is assigned to this primary input at B. As a result, at the signal line I, the logic value is 1 in a case of the absence of the fault or 0 in a case of the presence of the fault, so that the fault signal can be generated.

Next, in order to observe this fault signal at the primary output, it is necessary to activate the path which is connected to the primary output. For example, in a case of observing the fault signal through a signal line K. In this case, the object (H, 1) is generated first, and as the driving logic gate of the signal line H is OR, the objects (E, 1), (N, 0), and (O, 1) are subsequently generated sequentially. Then, as the signal line O is the primary input, the logic value 1 is assigned to this primary input at 0.

At this point, however, as the fault signal has not passed through the signal line K yet, so that the object (H, 1) is generated again. Then, similarly as above, the objects (E, 1) and (N, 0) are generated subsequently. In this case, the primary input at 0 has already assigned the logic value 1, so that the object generated from the object (N, 0) is going to (A, 1). Then, as the signal line A is the primary input, the logic value 1 is assigned to this primary input at A. As a consequence, a signal line N is going to have the logic value 0, a signal line E is going to have the logic value 1, a signal line H is going to have the logic value 1, a signal line F is going to have the logic value 0, a signal line G is going to have the logic value 0, a signal line J is going to have the logic value 0, and a signal line M is going to have the logic value 0.

In this case, the fault signal has reached to the signal line K, but the primary output M is going to have the logic value 0, so that the fault signal cannot be observed at the primary output. In order to resolve this conflict, according to [Ref. 1], the assignments of the logic values are carried out anew by the backtracking operation. Here, the last assignment of the logic value made was the setting of the level 1 to the signal line A, so that the level 0 is re-assigned to the signal line A by the backtracking. As a consequence, a signal line N is going to have the logic value 1, a signal line E is going to have the logic value 0, a signal line F is going to have the logic value 0, a signal line G is going to have the logic value 0, a signal line H is going to have the logic value 0, a signal line K is going to have the logic value 0, and a signal line M is going to have the logic value 0. Thus, the conflict is still not resolved, so that the further backtracking is necessary.

Thus, next, the signal line A is set back to the variable value, and the setting of the logic value 0 to the signal line O is tried. The result of this try is again that the conflict is still not resolved, so that the further backtracking is necessary.

Thus, next, the signal line O is set back to the variable value, and the setting of the logic value 1 to the signal line B is tried. The result of this try is that the conflict is resolved, but the signal line I is going to have the variable value, so that the object (I, 1) for producing the fault signal is generated again. In this case, as the signal line B has the logic value 1, the object (C, 0) is generated from the object (I, 1), and as the signal line C is the primary input, the logic value 0 is assigned to this primary input at C. As a result, the fault signal reaches to the signal line K, so that in order to observe this fault signal at the primary output M, the object (J, 1) is generated next. Hereafter, in the procedure similar to that described above, the logic value 1 is assigned to the primary input at 0 and the primary input at A, and it becomes possible to observe the fault signal at the primary output M.

According to [Ref. 1], this procedure is repeated until either the fault signal reaches to the primary output, or all the primary input logic value settings are exhausted.

In such a conventional test pattern generation method, however, as a number of backtracking operations increases, the re-assignments of the logic values are going to be repeated many times, so that the speed of the test pattern generation become slower.

Thus, in order to carry out the test pattern generation efficiently, it is necessary to reduce the number of backtracking operations. However, in the conventional test pattern generation method, there are cases in which many assignments of the logic values are required until the conflict can be found, and in such cases, the backtracking operations are going to be carried out for these many assigned logic values, so that an enormous amount time can be required for resolving the conflict, and consequently the efficiency of the test pattern generation can be lowered significantly.

Therefore, the early discovery and the early resolution of the conflict have a crucially importance to the speeding up of the test pattern generation.

SUMMARY OF THE INVENTION

It is therefore an object of the present invention to provide a method and a system for generating test patterns for logic circuits which can generate the test patterns effectively and efficiently by making the assignments of the fewer logic values at earlier stages, so as to reduce the number of backtracking operations required.

According to one aspect of the present invention there is provided a method for generating a test pattern for a logic circuit given by primary input logic values for setting a logic value of a specified signal line within the logic circuit at a specified level, comprising the steps of: checking whether a fault can be propagated to the specified signal line or not; deriving other signal lines whose logic values are uniquely determinable from the specified level of the specified signal line, only when it is judged that the fault cannot be propagated to the specified signal line at the checking step; judging whether the primary inputs are contained among the other signal lines derived at the deriving step; and making an assignment of the specified level to the specified signal line, and setting the uniquely determinable logic values for those of the other signal lines which are judged as the primary inputs by the Judging step as the primary input logic values giving the test pattern.

According to another aspect of the present invention there is provided a method for generating a test pattern for a logic circuit given by primary input logic values for which at least one of primary outputs can observe a fault signal which takes different logic values depending on a presence or absence of a fault, comprising the sequential steps of: (1) obtaining one signal line within the logic circuit and one logic level that can possibly be required to said one signal line in order to observe the fault signal at said at least one primary outputs; (2) judging whether it is possible to assign said one logic level to said one signal line, and returning to the step (1) when it is judged that it is not possible to assign said one logic level to said one signal line, or else deriving all other signal lines whose logic values are uniquely determinable from an assignment of said one logic level to said one signal line, when it is judged that it is possible to assign said one logic level to said one signal line; (3) judging whether said other signal lines contain a prescribed signal line or not, and returning to the step (1) when it is judged that said other signal lines do not contain the prescribed signal line, or else actually assigning said one logic level to said one signal line and deriving all logic values determinable by an assignment of said one logic level to said one signal line; (4) judging whether the test pattern can be obtained or not and has been obtained by the logic values derived at the step (3), and returning to the step (1) when it is judged that the test pattern can be obtained but has not been obtained by the logic values derived at the step (3), or else setting the logic values derived at the step (3) as the primary input logic values giving the test pattern; (5) judging whether an assignment of a different logic value to a latest signal line to have the logic value actually assigned has already been tried or not, when it is judged that the test pattern cannot be obtained at the step (4); (6) assigning the different logic value to said latest logic line, deriving other signal lines whose logic values are uniquely determinable from an assignment of said different logic value to said latest signal line, and returning to the step (4), when it is judged that the assignment of the different logic value has not been tried at the step (5); and (7) resetting a logic value of said latest signal line to variable value, propagating an influence of the resetting to all remaining signal lines, and returning to the step (5), when it is judged that the assignment of the different logic value has already been tried at the step (5).

According to another aspect of the present invention there is provided a method for generating a test pattern for a logic circuit given by primary input logic values for which at least one of primary outputs can observe a fault signal which takes different logic values depending on a presence or absence of a fault, comprising the sequential steps of: (1) obtaining one signal line within the logic circuit and one logic level that can possibly be required to said one signal line in order to produce the fault signal at a location of the fault, or to control a logic value of said one signal line, or else to propagate the fault signal to an output of a logic block having the fault signal as its input; (2) judging whether it is possible for the fault signal to reach said one signal line, and returning to the step (1) when it is judged that it is possible for the fault signal to reach said one signal line, or else deriving all other signal lines whose logic values are uniquely determinable from an assignment of said one logic level to said one signal line, when it is judged that it is not possible for the fault signal to reach said one signal line; (3) judging whether said other signal lines contain a prescribed signal line or not, and returning to the step (1) when it is judged that said other signal lines do not contain the prescribed signal line, or else actually assigning said one logic level to said one signal line and deriving all logic values determinable by an assignment of said one logic level to said one signal line; (4) judging whether the logic values derived at the step (3) realize a case including a logic value identical to the fault at the location of the fault, or a case including a logic value opposite to that of already assigned logic value, or else a case including identical logic values for all outputs of the logic block having the fault signal as its input; (5) judging whether the test pattern has been obtained by the logic values derived at the step (3) when it is judged that none of the cases is realized at the step (4), and returning to the step (1) when it is judged that the test pattern has not been obtained by the logic values derived at the step (3), or else setting the logic values derived at the step (3) as the primary input logic values giving the test pattern; (6) judging whether an assignment of a different logic value to a latest signal line to have the logic value actually assigned has already been tried or not, when it is judged that any of the cases is realized at the step (4); (7) assigning the different logic value to said latest logic line, deriving other signal lines whose logic values are uniquely determinable from an assignment of said different logic value to said latest signal line, and returning to the step (4), when it is judged that the assignment of the different logic value has not been tried at the step (6); and (8) resetting a logic value of said latest signal line to variable value, propagating an influence of the resetting to all remaining signal lines, and returning to the step (6), when it is judged that the assignment of the different logic value has already been tried at the step (6).

According to another aspect of the present invention there is provided a method for generating a test pattern for a logic circuit given by primary input logic values for which at least one of primary outputs can observe a fault signal which takes different logic values depending on a presence or absence of a fault, comprising the sequential steps of: (0) obtaining a set of signal lines to which logic values can be assigned independently from each other among signal lines of the logic circuit; (1) obtaining one signal line within the logic circuit and one logic level that can possibly be required to said one signal line in order to produce the fault signal at a location of the fault, or to control a logic value of said one signal line by the signal lines of the set obtained at the step (0), or else to propagate the fault signal to an output of a logic block having the fault signal as Its input; (2) judging whether it is possible for the fault signal to reach said one signal line, and returning to the step (1) when it is judged that it is possible for the fault signal to reach said one signal line, or else deriving all other signal lines whose logic values are uniquely determinable from an assignment of said one logic level to said one signal line, when it is judged that it is not possible for the fault signal to reach said one signal line; (3) judging whether said other signal lines contain the signal lines of the set obtained at the step (0) or not, and returning to the step (1) when it is judged that said other signal lines do not contain the prescribed signal line, or else actually assigning said one logic level to said one signal line and deriving all logic values determinable by an assignment of said one logic level to said one signal line; (4) judging whether the logic values derived at the step (3) realize a case including a logic value identical to the fault at the location of the fault, or a case including a logic value opposite to that of already assigned logic value, or else a case including identical logic values for all outputs of the logic block having the fault signal as its input; (5) judging whether the test pattern has been obtained by the logic values derived at the step (3) when it is judged that none of the cases is realized at the step (4), and returning to the step (1) when it is judged that the test pattern has not been obtained by the logic values derived at the step (3), or else setting the logic values derived at the step (3) as the primary input logic values giving the test pattern; (6) judging whether an assignment of a different logic value to a latest signal line to have the logic value actually assigned has already been tried or not, when it is judged that any of the cases is realized at the step (4); (7) assigning the different logic value to said latest logic line, deriving other signal lines whose logic values are uniquely determinable from an assignment of said different logic value to said latest signal line, and returning to the step (4), when it is judged that the assignment of the different logic value has not been tried at the step (6); and (8) resetting a logic value of said latest signal line to variable value, propagating an influence of the resetting to all remaining signal lines, and returning to the step (6), when it is judged that the assignment of the different logic value has already been tried at the step (6).

According to another aspect of the present invention there is provided a system for generating a test pattern for a logic circuit given by primary input logic values for setting a logic value of a specified signal line within the logic circuit at a specified level, comprising the steps of: means for checking whether a fault can be propagated to the specified signal line or not; means for deriving other signal lines whose logic values are uniquely determinable from the specified level of the specified signal line, only when it is judged that the fault cannot be propagated to the specified signal line by the checking means; means for judging whether the primary inputs are contained among the other signal lines derived by the deriving means; and means for making an assignment of the specified level to the specified signal line, and setting the uniquely determinable logic values for those of the other signal lines which are judged as the primary inputs by the judging means as the primary input logic values giving the test pattern.

Other features and advantages of the present invention will become apparent from the following description taken in conjunction with the accompanying drawings.

BRIEF DESCRIPTION OF THE DRAWINGS

FIG. 6 is a diagrammatic illustration of a decision tree utilized in the test pattern generation method according to the present invention.

FIG. 7 is a table summarizing the rules for generating new objects in the operation according to the flow chart of FIG. 5.

FIG. 8 is a diagrammatic illustration of the data structure for managing the triplet objects in the operation according to the flow chart of FIG. 5.

DETAILED DESCRIPTION OF THE PREFERRED EMBODIMENTS

Now, the test pattern generation method for logic circuits according to the present invention will be described in detail.

In short, the method according to the present invention is a method which obtains the primary input logic values for setting the logic value of the specified signal line within the logic circuit at the specified level, in which other signal lines whose logic values are uniquely determinable are derived from the specified level of the specified signal line, and whether the primary input is contained among the derived signal lines is judged, and then the assignment of the specified level to the specified signal line is made whenever the primary input is contained among the derived signal lines.

Here, it is preferable to check whether the fault can be propagated to the specified signal line or not in advance, and carry out the above procedure only when it is judged that the fault cannot be propagated to the specified signal line.

In the above procedure, the logic values of a plurality of primary inputs can be determined by an assignment of the logic value to the signal line, so that the test pattern can be generated with fewer assignments of the logic values. In addition, the assignments of the logic values can be made before the object reaches to the primary input, so that the logic value assignments at the earlier stages can be realized.

Figure 4:
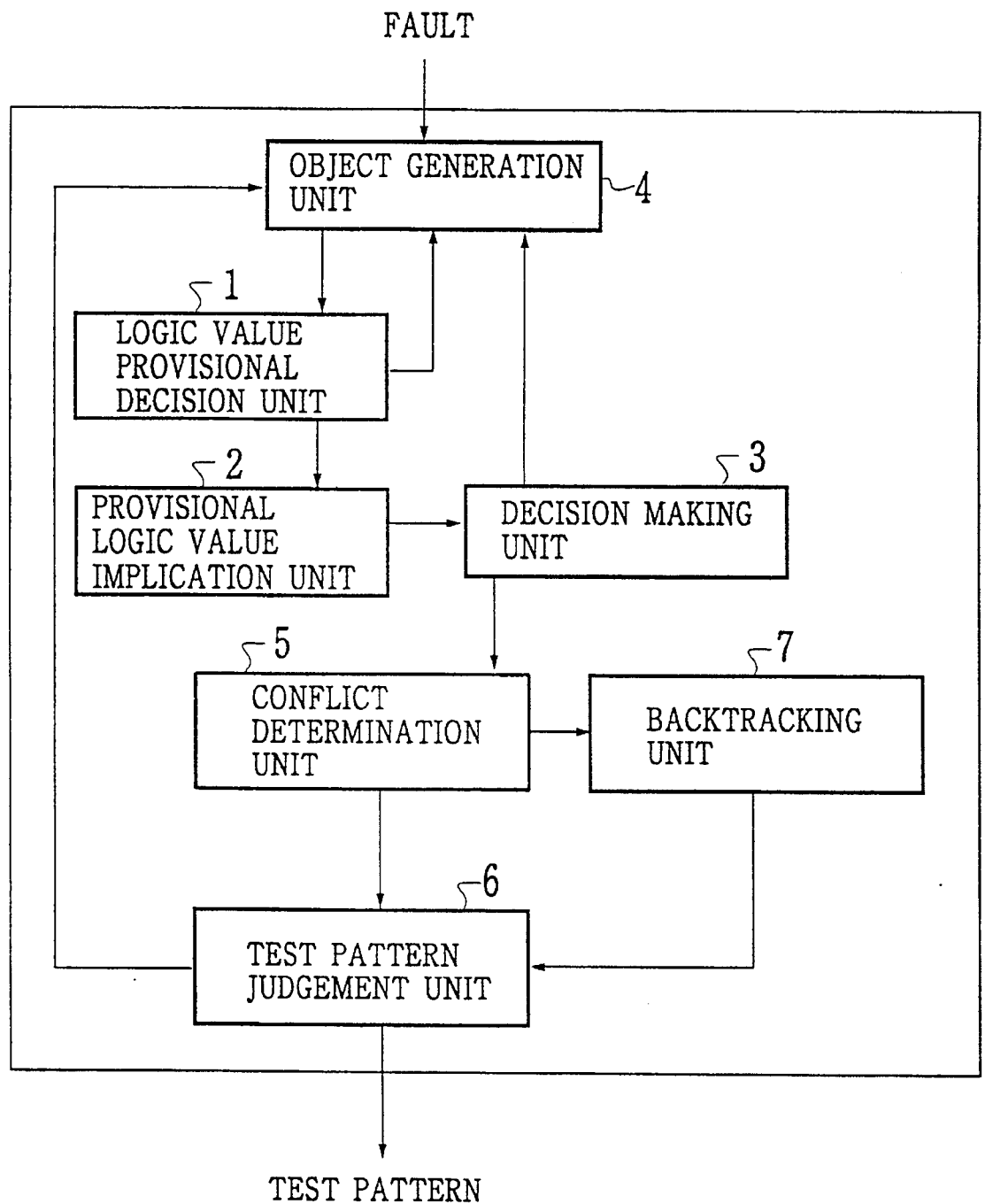
FIG. 4 is a schematic block diagram of a system for realizing one embodiment of the test pattern generation method according to the present invention.

Referring now to FIG. 4, one embodiment of the test pattern generation method for logic circuits according to the present invention will be described.

In this embodiment, a system for realizing the test pattern generation method has a configuration as shown in FIG. 4, which comprises: an object generation unit 4; a logic value provisional decision unit 1 connected with the object generation unit 4; a provisional logic value complication unit 2 connected with the logic value provisional decision unit 1; a decision making unit 3 connected with the provisional logic value implication unit 2 and the object generation unit 4; a conflict determination unit 5 connected with the decision making unit 3; a backtracking unit 7 connected with the conflict determination unit 5; and a test pattern judgement unit 6 connected with the conflict determination unit 5, the backtracking unit 7, and the object generation unit 4.

In this configuration of FIG. 4, the object generation unit 4 generates an object required in generating the test pattern for each fault. Here, in a case of using the doublet object as in [Ref. 1] and [Ref. 2] mentioned above, each object is given as a set of a signal line and a logic value to be set to that signal line, while in a case of using the triplet object as in [Ref. 3] mentioned above, each object is given as a set of a signal line, a number of requests for logic value 1 with respect to that signal line, and a number of requests for logic value 0 with respect to that signal line.

The logic value provisional decision unit 1 determines whether or not to make a provisional decision of the logic value for the object generated by the object generation unit 4. In a case of making the provisional decision, the particular logic value for the provisional decision is also determined by this logic value provisional decision unit 1, whereas otherwise the operation returns to the object generation unit 4 to generate a new object.

In a case the provisional decision is made by the logic value provisional decision unit 1, the provisional logic value implication unit 2 obtains a region within which the provisional logic value can be propagated.

The decision making unit 3 judges whether tile provisional logic value has reached to the primary input or not. In a case the provisional logic value has not reached the primary input, the operation returns to the object generation unit 4 to generate a new object. On the other hand, in a case the object has reached the primary input, the decision making unit 3 makes an actual decision for the assignment of the particular logic value at the signal line of the object to which the provisional decision had been made by the logic value provisional decision unit 1.

In a case the actual decision is made by the decision making unit 3, the conflict determination unit 5 determines whether there is a conflict in the actual decision made by the decision making unit 3 or not. In a case the conflict is found by the conflict determination unit 5, the backtracking unit 7 carries out the backtracking in which the decision making is carried out anew.

The test pattern judgement unit 6 judges whether the test pattern has been obtained or not by checking whether there is a difference in the primary output logic value for the normal circuit and the circuit with fault. If it is judged that the test pattern has been obtained, the logic value assigned to the primary input is outputted as the appropriate test pattern, whereas otherwise the operation returns to the object generation unit 4 to generate an object required in generating the test pattern for each fault again.

Now, the operation of this system of FIG. 4 in a case of using the triplet object as in [Ref. 3] mentioned above will be described. In this case, each object is given as a set of a signal line, a number of requests for logic value 1 with respect to that signal line, and a number of requests for logic value 0 with respect to that signal line, and the operation proceeds according to the flow chart of FIG. 5 as follows.

First, at the step 110, the logic value is assigned to the fault signal line for a target fault with respect to which the test pattern is to be generated such that the logic value 0 is assigned in a case of the stuck at 1 fault, and the logic value 1 is assigned in a case of the stuck at 0 fault. Then, the logic values are also assigned for those signal lines for which the logic values are uniquely determinative as a result of the assignment of the logic value for the fault signal line.

Next, at the step 120, an uncontrolled object is generated at the object generation unit 4. Here, for each signal line for which the logic value has been assigned, in a case the logic value of that signal line is not controlled by the input value of the logic gate which is driving that signal line, that signal line is set to an object queue as an object along with a number of requests for the logic value assigned to that signal line increased by one.

Then, the object is read out from the object queue at the step 130, and the logic value provisional decision unit 1 determines whether or not to make a provisional decision of the logic value for the read out object at the step 140. Here, in a case the signal line of the object is unaffected by the target fault, it is determined that the provisional decision can be made so that the operation proceeds to the step 150 next, whereas otherwise the operation proceeds to the step 170 next.

At the step 150, the logic value provisional decision unit 1 makes the provisional decision of the logic value such that the logic value 1 is provisionally assigned when the number of requests for the logic value 1 exceeds the number of requests for the logic value 0, and the logic value 0 is provisionally assigned otherwise. At this point, the provisional logic value implication unit 2 propagates the provisionally assigned logic value through the signal lines within the circuit, and those signal lines for which the logic values are uniquely determinative as a result of the provisional logic value assignment made by the logic value provisional decision unit 1 are obtained. Then, after memorizing farthest affected signal lines up to which the influence of the provisionally assigned logic value can be propagated, the provisional logic value implication unit 2 reset the provisionally propagated logic values to the original values and the operation proceeds to the step 160.

At the step 160, the decision making unit 3 determines whether or not to make the actual decision of the logic value for the object or not. Here, in a case the farthest affected signal lines memorized at the step 150 contains the primary input, it is determined that the actual decision is to be made, so that the actual decision for the assignment of the logic value for the signal line of the object is made at the step 175, whereas otherwise the operation proceeds to the step 170 next. In a case the actual decision is made at the step 175, the signal line, the decided logic value, and a remaining alternative flag or a no remaining alternative flag indicating whether an alternative decision opposite to the decided logic value is possible or not for that signal line are recorded as a record in a decision tree In a structure shown in FIG. 6, and the operation proceeds to the step 180 next.

At the step 170, the object generation unit 4 generates a new object for backtracing, and after it is set to the object queue, the operation returns to the step 130 described above. Here, the new object is generated according to the rules summarized in a table shown in FIG. 7. Namely, the number of requests for the logic value 1 and the number of requests for the logic value 0 to be set to the new object are determined according to the type of the logic gate which is driving the object, and then the new object is generated for each signal line among the input signal lines of that driving logic gate for which the number of requests for the logic value 1 or the number of requests for the logic value 0 is greater than or equal to 1.

At the step 180, the conflict determination unit 5 determines the implication of the logic values due to the actual decision, i.e., the logic values for those signal lines for which the logic values are uniquely determinative as a result of the actual decision of the logic value assignment made at the step 175. Here, for these signal lines for which the logic values are uniquely determinative, the flag in the decision tree of FIG. 6 is set to be the no remaining alternative flag. Then, the conflict determination unit 5 checks the presence of the conflict. Here, the conflict includes a case of obtaining the same logic value at a fault position as in a case of the fault, a case of causing a collision of the logic values 0 and 1 between the already assigned logic value and the newly decided logic value for the signal line, and a case of extinguishing all the paths for propagating the fault signal to the primary output.

Then, whether the backtracking is necessary or not is determined at the step 185. Here, in a case the conflict is found at the step 180 and the decision tree of FIG. 6 is empty, the target fault is outputted as the redundant fault and the operation terminates. In a case the conflict is found at the step 180 and the decision tree of FIG. 6 is not empty, the operation proceeds to the step 200, while in a case the conflict is not found at the step 180, the operation proceeds to the step 190.

At the step 200, the backtracking operation is carried out by tracing the decision tree backwards until the signal line for which the alternative decision is possible is encountered. During this tracing, the logic value of the signal line for which the alternative decision is impossible is reset to the variable value and this change is propagated toward the output side, while the entry for that signal line is deleted from the decision tree. For the signal line for which the alternative decision is possible, the decision is made anew, and the newly decided logic value is recorded in the decision tree along with the no remaining alternative flag. Then, the operation returns to the step 180.

At the step 190, the test pattern judgement unit 6 judges whether there is such a signal line among those signal lines for which the logic values are assigned whose assigned logic value is not controlled by the input signal of the logic gate driving that signal line or not. In a case there is such a signal line, the operation returns to the step 120 for the next uncontrolled object. In a case there is no such a signal line and the fault signal can be detected at the primary output, the assigned logic values of the primary inputs are outputted as the test pattern. In a case there is no such a signal line but the fault signal is not detected at the primary output, the operation proceeds to the step 210 next.

At the step 210, one logic gate having the fault signal as its input and the variable value as its output is selected, and a fault implication object for propagating the fault signal to the output side is generated. Here, the fault implication object is obtained such that the number of requests for the logic value 1 is increased by one for all the other signal lines having the variable values in a case that signal line is an input of AND or NAND, while the number of requests for the logic value 0 is increased by one for all the other signal lines having the variable values in a case that signal line is an input of OR or NOR. After this object is set to the object queue, the operation returns to the step 130 described above.

Figure 5:
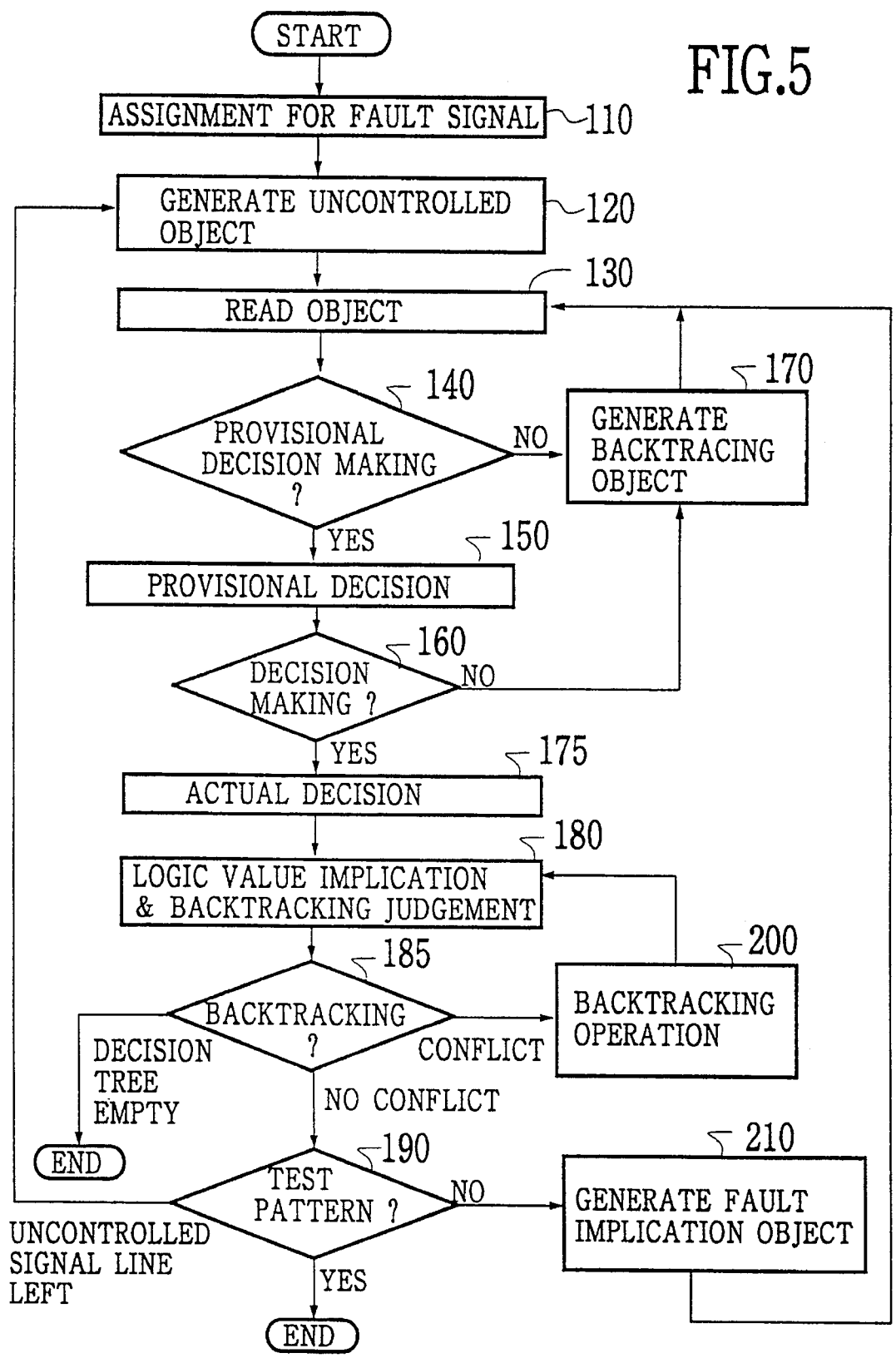
FIG. 5 is a flow chart for the operation of the system of FIG. 4 according to the test pattern generation method of the present invention in a case of using the triplet objects.

In this procedure of FIG. 5, the objects are managed by the data structure as shown in FIG. 8 in which each object is given as a set of a signal line, a number of requests for logic value 1 with respect to that signal line, and a number of requests for logic value 0 with respect to that signal line, as described above.

Next, the operation of this system of FIG. 4 in a case of using the doublet object as In [Ref. 1] and [Ref. 2] mentioned above will be described. In this case, each object is given as a set of a signal line and a logic value to be set to that signal line, and the operation proceeds according to the flow chart of FIG. 9 as follows.

First, at the step 701, the signal line is traced from the target fault toward the output side, while setting the fault affected flag to each signal line encountered in a course of the tracing, so as to derive the fault affected region.

Then, at the step 702, the object is generated from the target fault. Here, in a case of the stuck at 1 fault at a signal line of the object, the level 0 is set to that signal line, while in a case of the stuck at 0 fault at a signal line of the object, the level 1 is set to that signal line.

Next, at the step 703, whether the signal line of the object is the primary input or not is judged. If so, the operation proceeds to the step 708 described below, whereas otherwise the operation proceeds to the step 704 next.

At the step 704, whether the signal line of the object has the fault affected flag or not is judged. If so, the operation proceeds to the step 705 next, whereas otherwise the operation proceeds to the step 706 next.

At the step 705, a new object is generated according to the level of the object and the type of the logic gate driving that signal line, by the following rules.

(1) In a case the driving logic gate is AND, and the level of the object is 0, the signal line of the new object is set to be an input signal line with the variable value among the input signals of the driving logic gate of the object, while the level of the new object is set to be 0.

(2) In a case the driving logic gate is AND, and the level of the object is 1, the signal line of the new object is set to be an input signal line with the variable value among the input signals of the driving logic gate of the object, while the level of the new object is set to be 1.

(3) In a case the driving logic gate is NAND, and the level of the object is 0, the signal line of the new object is set to be an input signal line with the variable value among the input signals of the driving logic gate of the object, while the level of the new object is set to be 1.

(4) In a case the driving logic gate is NAND, and the level of the object is 1, the signal line of the new object is set to be an input signal line with the variable value among the input signals of the driving logic gate of the object, while the level of the new object is set to be 0.

(5) In a case the driving logic gate is OR, and the level of the object is 0, the signal line of the new object is set to be an input signal line with the variable value among the input signals of the driving logic gate of the object, while the level of the new object is set to be 0.

(6) In a case the driving logic gate is OR, and the level of the object is 1, the signal line of the new object is set to be an input signal line with the variable value among the input signals of the driving logic gate of the object, while the level of the new object is set to be 1.

(7) In a case the driving logic gate is NOR, and the level of the object is 0, the signal line of the new object is set to be an input signal line with the variable value among the input signals of the driving logic gate of the object, while the level of the new object is set to be 1.

(8) In a case the driving logic gate is NOR, and the level of the object is 1, the signal line of the new object is set to be an input signal line with the variable value among the input signals of the driving logic gate of the object, while the level of the new object is set to be 0.

The operation then returns from this step 705 to the step 703 described above.

At the step 706, the object is propagated toward the input side and the determinative objects are generated in a course of the propagation. Here, the propagation continued as long as the determinative object can be generated by the propagation, and the determinative object can be generated according to the following conditions.

(i) In a case the driving logic gate of the object is AND and the level of the object is 0, when there is only one input with the variable value among the input signals of the driving logic gate, the determinative object is generated by setting the level 0 to that only one input with the variable value.

(ii) In a case the driving logic gate of the object is AND and the level of the object is 1, the determinative object is generated by setting the level 1 to all the inputs with the variable values among the input signals of the driving logic gate.

(iii) In a case the driving logic gate of the object is NAND and the level of the object is 0, the determinative object is generated by setting the level 1 to all the inputs with the variable values among the input signals of the driving logic gate.

(iv) In a case the driving logic gate of the object is NAND and the level of the object is 1, when there is only one input with tile variable value among the input signals of the driving logic gate, the determinative object is generated by setting the level 0 to that only one input with the variable value.

(v) In a case the driving logic gate of the object is OR and the level of the object is 0, the determinative object is generated by setting the level 0 to all the inputs with the variable values among the input signals of the driving logic gate.

(vi) In a case the driving logic gate of the object is OR and the level of the object is 1, when there is only one input with the variable value among the input signals of the driving logic gate, the determinative object is generated by setting the level 1 to that only one input with the variable value.

(vii) In a case the driving logic gate of the object is NOR and the level of the object is 0, when there is only one input with the variable value among the input signals of the driving logic gate, the determinative object is generated by setting the level 1 to that only one input with the variable value.

(viii) In a case the driving logic gate of the object is NOR and the level of the object is 1, the determinative object is generated by setting the level 0 to all the inputs with the variable values among the input signals of the driving logic gate.

Next, at the step 707, whether the determinative objects derived at the step 706 contain the primary input or not is determined. If the primary input is contained, the operation proceeds to the step 708 next, whereas otherwise the operation proceeds to the step 705 described above.

At the step 708, the level of object is assigned as the logic value for the signal line of the object, and the signal line and the assigned logic value are recorded into the decision tree of FIG. 6 along with the remaining alternative flag.

Then, at the step 709, the assigned logic value is propagated to both of the input and output sides. In a course of this propagation, the logic values implied on the input side are recorded into the decision tree with the no remaining alternative flag.

Next, at the step 710, whether there is a conflict or not is determined. Here, the conflict includes a case of obtaining the same logic value at a fault position as in a case of the fault, a case of causing a collision of the logic values 0 and 1 between the already assigned logic value and the newly decided logic value for the signal line, and a case of extinguishing all the paths for propagating the fault signal to the primary output. Then, in a case the fault signal line has variable value, the operation returns to the step 702 described above for next object. In a case there is a conflict, the operation proceeds to the step 711 next, while in a case there is no conflict, the operation proceeds to the step 712 next.

At the step 711, when the decision tree is empty, the fault is judged as the untestable fault, and the operation terminates. Otherwise, the backtracking operation is carried out by checking the last recorded entry in the decision tree. Here, when the last recorded entry has the remaining alternative flag, the flag is changed to the no remaining alternative flag, and the logic value opposite to the previously assigned one is assigned to the signal line of this entry. Then, the operation returns to the step 709. On the other hand, the last recorded entry has the no remaining alternative flag, the variable value is assigned to the signal line of this entry, and this is propagated toward the output side, while this entry is deleted from the decision tree. Then, the backtracking operation is continued by checking the updated last recorded entry in the decision tree.

At the step 712, whether there is any uncontrolled Nine or not is determined, i.e., whether there is an input of the driving logic gate of the signal line of the object by which the logic value of that signal line is not controlled or not is checked. When there is such an uncontrolled line, a new object is generated by that signal line as a signal line of the new object and the logic value assigned to that signal line as a level of the new object at the step 713, and the operation returns to the step 703 described above.

Otherwise, next at the step 714, whether the test pattern has been obtained or not Is determined. Namely, when the fault signal can be observed at at least one primary output, i.e., when the normal state and the fault state produce opposite values for at least one primary output, the logic values assigned to the primary inputs are outputted as the test pattern for the target fault and the operation terminates, whereas otherwise the operation proceeds to the step 715 next.

At the step 715, one logic gate having the fault signal as its input and the variable value as its output is selected, and a fault implication object for propagating the fault signal to the output side is generated. Here, the fault implication object is obtained according to the following rules.

(I) In a case the driving logic gate is AND, the signal line of the object is set to be an input signal line with the variable value among the input signals of the driving logic gate, while the level of the object is set to be 1.

(II) In a case the driving logic gate is NAND, and the signal line of the object is set to be an input signal line with the variable value among the input signals of the driving logic gate of the object, while the level of the object is set to be 1.

(III) In a case the driving logic gate is OR, the signal line of the object is set to be an input signal line with the variable value among the input signals of the driving logic gate of the object, while the level of the object is set to be 0.

(IV) In a case the driving logic gate is NOR, the signal line of the object is set to be an input signal line with the variable value among the input signals of the driving logic gate of the object, while the level of the object is set to be 0.

Then, the operation returns to the step 703 described above.

Figure 1:
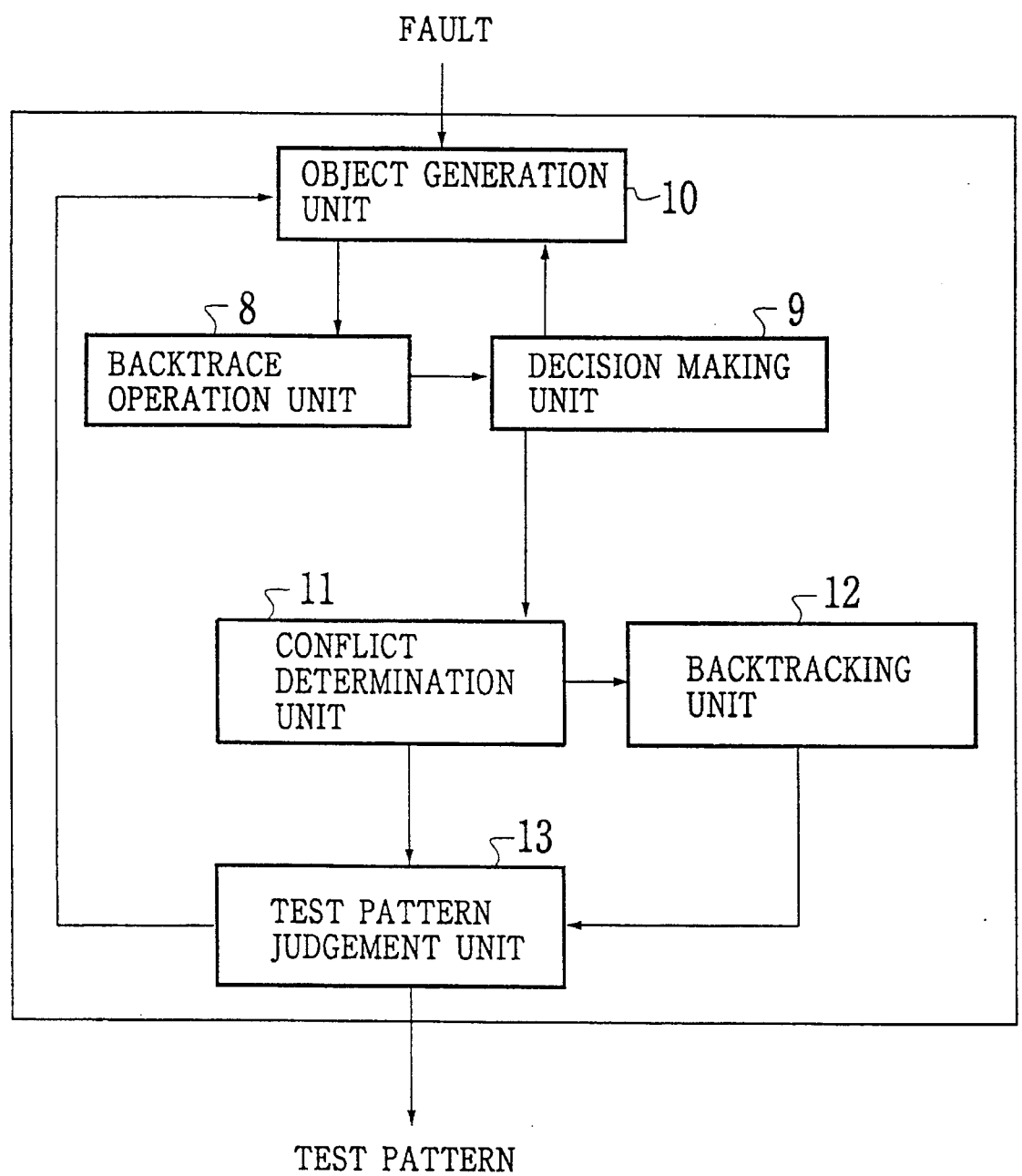
FIG. 1 is a schematic block diagram of a system for realizing an exemplary conventional test pattern generation method.
Figure 2:
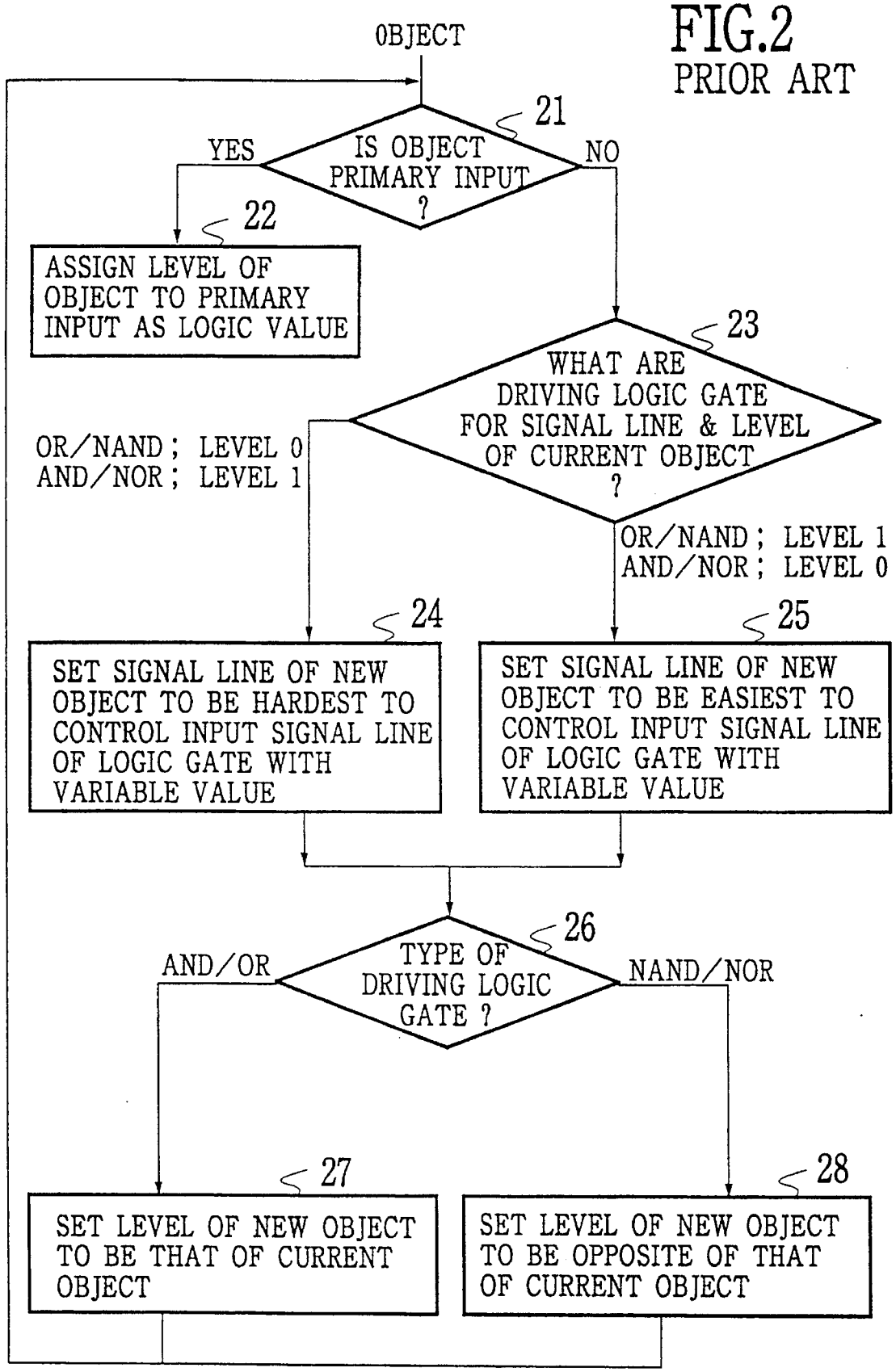
FIG. 2 is a flow chart for the operation of the system of FIG. 1 according to the exemplary conventional test pattern generation method.
Figure 3:
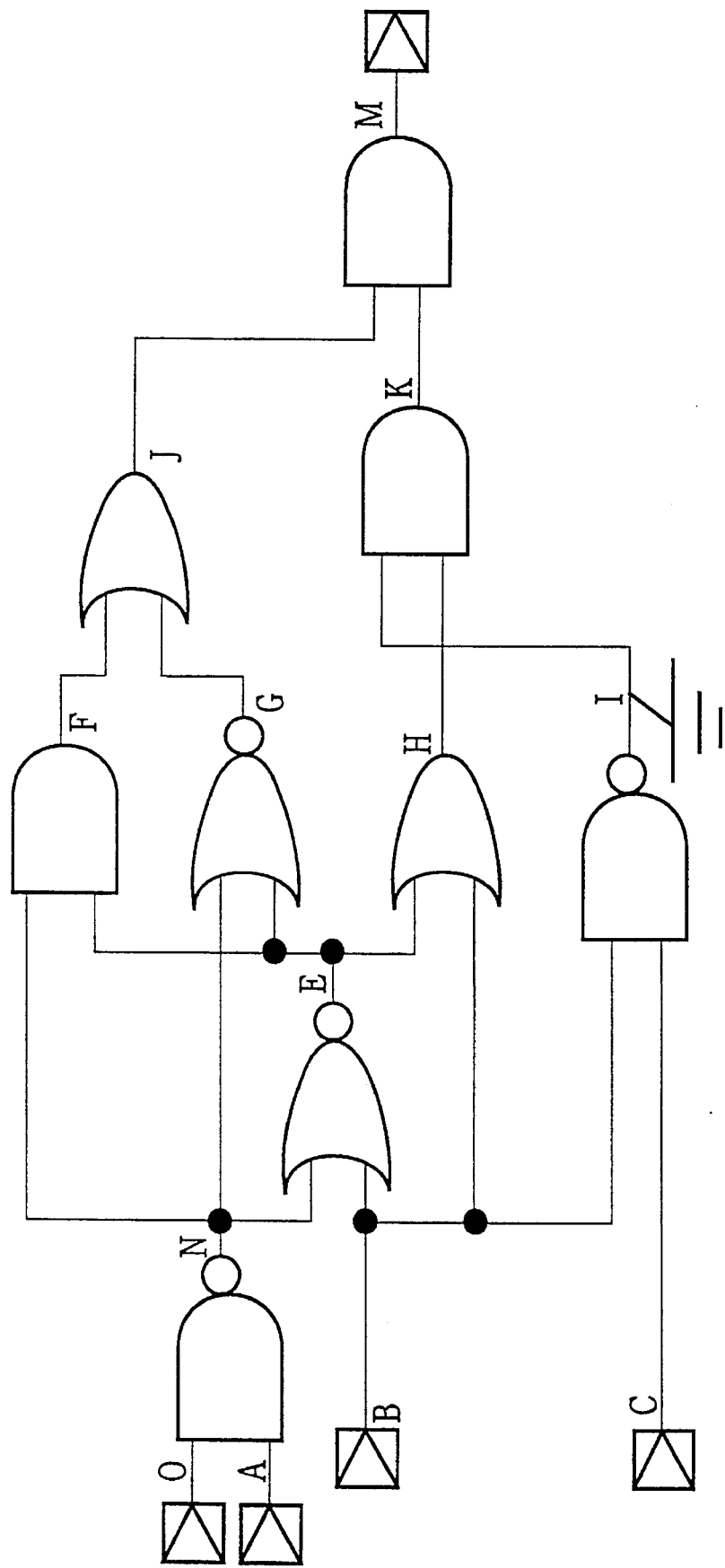
FIG. 3 is a circuit diagram of an exemplary circuit for illustrating operations of the exemplary conventional test pattern generation method and the test pattern generation method according to the present invention.

Now, as a concrete illustrative example, for an exemplary circuit shown in FIG. 3, the test pattern generation according to the test pattern generation method of the present invention proceeds as follows. Here, in the circuit of FIG. 3, the stuck at 0 fault is assumed to be present at the signal line I as before.

Figure 9:
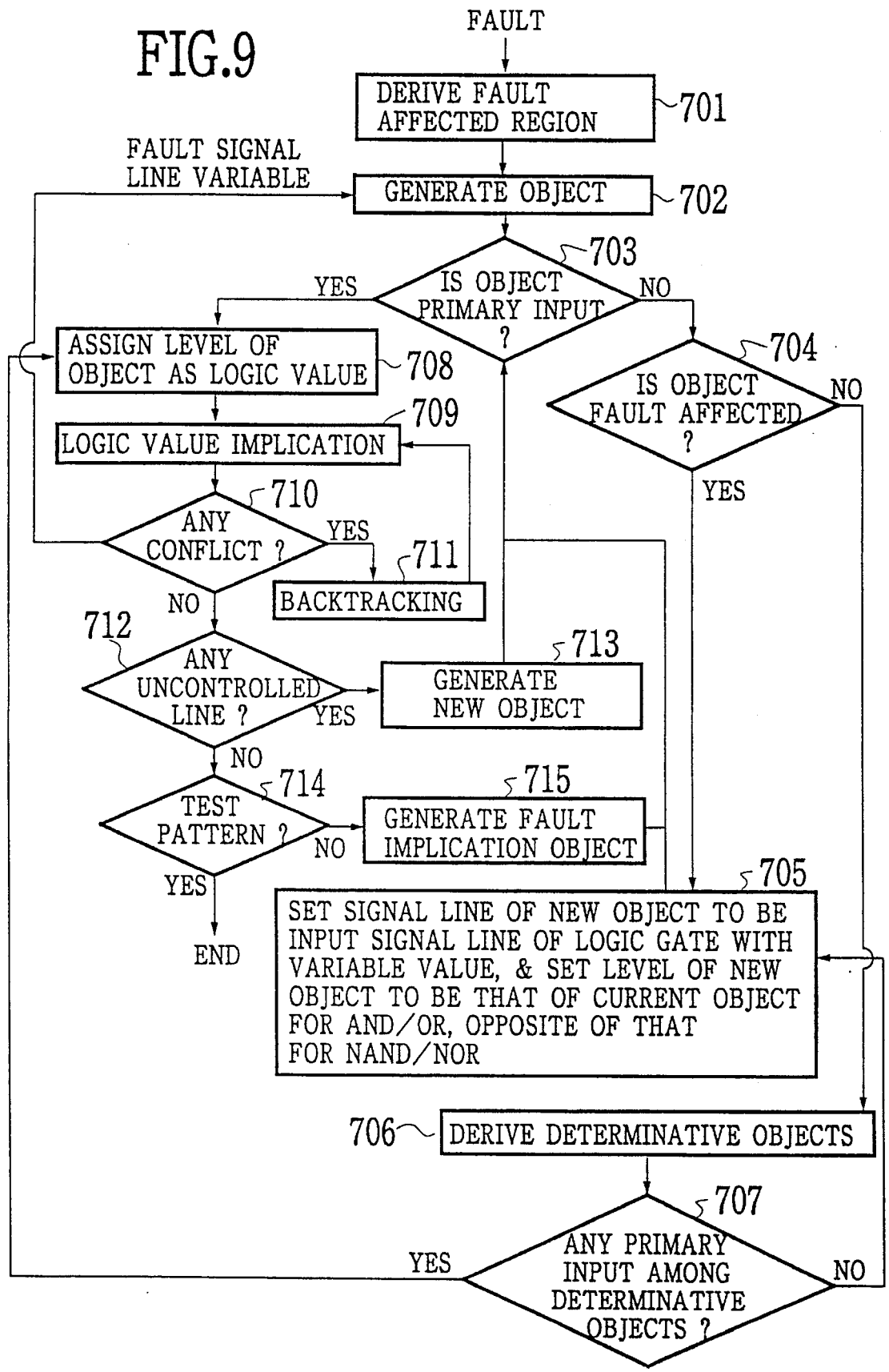
FIG. 9 is a flow chart for the operation of the system of FIG. 4 according to the test pattern generation method of the present invention in a case of using the doublet objects.

In this case, by the step 701 of FIG. 9, the signal line is traced toward the output side from the signal line I, and the signal lines I, K, and M are obtained as the fault affected signal lines.

Then, by the step 702 of FIG. 9, the object (I, 1) is generated. In this case, by the step 703 of FIG. 9, it is judged that the signal line I is not the primary input, so that the step 704 is carried out next, and as the signal line I is the fault affected, the step 705 is carried out next.

By the step 705 of FIG. 9, as the driving logic gate of this object (I, 1) is NAND and the level of this object is 1, the new object (B, 0) is generated, and the operation returns to the step 703.

Next, by the step 703 of FIG. 9, it is judged that the signal line B is the primary input, so that the step 708 is carried out next. At the step 708, the logic value 0 is assigned to this primary input at B, and the assigned logic value is recorded into the decision tree along with the remaining alternative flag. Then, as a result of the logic value implication by the step 709 of FIG. 9, at the signal line I, the logic value is 1 in a case of the absence of the fault or 0 in a case of the presence of the fault, so that the fault signal can be generated.

In this case, no conflict is found by the step 710 of FIG. 9, so that the step 712 is carried out, and as all the assigned logic values are controlled by the input value of the logic gate, so that the step 714 is carried out. Then, in this case, as the fault signal is not observed at the primary output, the step 715 is carried out.

Next, by the step 715 of FIG. 9, the object (H, 1) is generated and the step 703 is carried out again. In this case, the signal line H is neither the primary input nor the fault affected signal line, so that the step 706 is carried out next.

By the step 706 of FIG. 9, as the driving logic gate of the signal line H is OR, the level is 1, and only the signal line E has the variable value, so that the determinative object (E, 1) is generated. Also, the driving logic gate of the signal line E is NOR, the level is 1, and only the signal line N has the variable value, so that another determinative object (N, 0) is generated. Moreover, the driving logic gate of the signal line N is NAND and the level is 0, so that another determinative objects (O, 1) and (A, 1) are also generated.

Then, by the step 707 of FIG. 9, it is judged that the signal lines 0 and A are primary inputs, so that the step 708 is carried out again at which the signal line H, the assigned logic value 1, and the remaining alternative flag are recorded in the decision tree. Then, as a result of the logic value Implication by the step 709 of FIG. 9, a signal line N is going to have the logic value 0, a signal line E is going to have the logic value 1, a signal line H is going to have the logic value 1, a signal line F is going to have the logic value 0, a signal line G is going to have the logic value 0, a signal line J is going to have the logic value 0, and a signal line M is going to have the logic value 0. Here, the signal lines E, N, O, and A are produced on the input side as a result of the assignment of the logic value 1 to the signal line H, so that these signal lines are recorded in the decision tree with the no remaining alternative flags.

In this case, a conflict is found by the step 710 of FIG. 9 as the fault signal has reached to the signal line K, but the primary output M is going to have the logic value 0, so that the fault signal cannot be observed at the primary output. In order to resolve this conflict, the assignments of the logic values are carried out anew by the backtracking operation at the step 711 of FIG. 9. Here, the last recorded entry in the decision tree with the remaining alternative flag is the assignment of the logic value 1 to the signal line H, so that the logic values for the signal lines E, N, O, and A are reset to the variable values, while the the logic value 0 is re-assigned to the signal line H and the flag for the signal line H is changed to the no remaining alternative flag by the backtracking. Then, as a result of the logic value implication by the step 709 of FIG. 9, a signal line H is going to have the logic value 0, a signal line K is going to have the logic value 0, and a signal line M is going to have the logic value 0, so that the conflict is still not resolved, and the further backtracking is carried out by the step 711.

In the further backtracking, the signal line H is set back to the variable value, and the setting of the logic value 1 to the signal line B is tried. The result of this try is that the signal line B has the logic value 1, the signal line E has the logic value 0, the signal line F has the logic value 0, and the signal line H has the logic value 1, so that the conflict is resolved, but the signal line I is going to have the variable value, so that the step 702 is carried out again to generate the object (I, 1) for producing the fault signal again.

In this case, as the signal line B has the logic value 1, the new object (C, 0) is generated from the object (I, 1), and as it is judged that the signal line C is the primary input by the step 703 of FIG. 9, the logic value 1 is assigned to this primary input at C by the step 708 of FIG. 9. Then, as a result of the logic value implication by the step 709 of FIG. 9, at the signal line I, the logic value is 1 in a case of the absence of the fault or 0 in a case of the presence of the fault, so that the fault signal can be generated. Also, the fault signal reaches to the signal line K as the signal line H has the logic value 1.

In this case, no conflict is found by the step 710, all the assigned logic values are found to be controlled by the input value of the logic gate by the step 712, and the fault signal is found to be not observed at the primary output by the step 714, the step 715 is carried out to generate the object (J, 1).

Here, the signal line J is neither the primary input not the fault affected signal line, so that the step 706 is carried out next, and as the driving logic gate of the signal line J is OR, the level is 1, and only the signal line G has the variable value, so that the determinative object (G, 1) is generated. Also, the determinative objects (N, 0), (O, 1), and (A, 1) are generated subsequently as before.

Then, by the step 707 of FIG. 9, it is judged that the signal lines O and A are primary inputs, so that the step 708 is carried out again at which the signal line J, the assigned logic value 1, and the remaining alternative flag are recorded in the decision tree. Then, as a result of the logic value implication by the step 709 of FIG. 9, a signal line O is going to have the logic value 1, a signal line A is going to have the logic value 1, a signal line N is going to have the logic value 0, a signal line G is going to have the logic value 1, a signal line J is going to have the logic value 1, and a signal line M is going to be the fault signal. Here, the signal lines G, N, O, and A are produced on the input side as a result of the assignment of the logic value 1 to the signal line J, so that these signal lines are recorded in the decision tree with the no remaining alternative flags.

In this case, no conflict is found by the step 710, all the assigned logic values are found to be controlled by the input value of the logic gate by the step 712, and the fault signal is found to be observed at the primary output M by the step 714, so that the assignments of the logic value 1 to the signal line O, the logic value 1 to the signal line A, the logic value 1 to the signal line B, and the logic value to the signal line C can be outputted as the test pattern.

In contrast to a case of the conventional method described above which requires the backtracking operation three times, the test pattern generation of the present invention requires the backtracking operation only twice for the same exemplary circuit. The reason for this reduction of the number of backtracking operations is that the assignment of the logic value 1 to the signal line H in the present invention corresponds to two assignments of the logic value 1 to the signal line O and the signal line A in the conventional method. Thus, according to the present invention, it is possible to provide a test pattern generation method for logic circuits which can generate the test pattern effectively and efficiently by making the assignments of the fewer logic values at earlier stages, and therefore, the early discovery and the early resolution of the conflict can be realized to speed up the test pattern generation as a whole.

It is to be noted that many modifications and variations of the above embodiment may be made without departing from the novel and advantageous features of the present invention. Accordingly, all such modifications and variations are intended to be included within the scope of the appended claims.

What is claimed is:

1. A method for generating a test pattern for a logic circuit given by primary input logic values for setting a logic value of a specified signal line within the logic circuit at a specified level, comprising the steps of:

checking whether a fault can possibly be propagated to the specified signal line or not;

deriving other signal lines whose logic values are uniquely determinable from the specified level of the specified signal line, only when it is judged that the fault cannot possibly be propagated to the specified signal line at the checking step;

judging whether the primary inputs are contained among the other signal lines derived at the deriving step; and making an assignment of the specified level to the specified signal line, and setting the uniquely determinable logic values for those of the other signal lines which are judged as the primary inputs by the judging step as the primary input logic values giving the test pattern.

2. A method for generating a test pattern for a logic circuit given by primary input logic values for which at least one of primary outputs can observe a fault signal which takes different logic values depending on a presence or absence of a fault, comprising the sequential steps of:

(1) obtaining one signal line within the logic circuit and one logic level that can possibly be required to said one signal line in order to observe the fault signal at said at least one of the primary outputs;

(2) judging whether it is possible to assign said one logic level to said one signal line, and returning to the step (1) when it is judged that it is not possible to assign said one logic level to said one signal line, or else deriving all other signal lines whose logic values are uniquely determinable from an assignment of said one logic level to said one signal line, when it is judged that it is possible to assign said one logic level to said one signal line;

(3) judging whether said other signal lines contain a prescribed signal line or not, and returning to the step (1) when it is judged that said other signal lines do not contain the prescribed signal line, or else actually assigning said one logic level to said one signal line and deriving all logic values determinable by an assignment of said one logic level to said one signal line;

(4) judging whether the test pattern can be obtained or not and has been obtained by the logic values derived at the step (3), and returning to the step (1) when it is judged that the test pattern can be obtained but has not been obtained by the logic values derived at the step (3), or else setting the logic values derived at the step (3) as the primary input logic values giving the test pattern;

(5) judging whether an assignment of a different logic value to a latest signal line to have the logic value actually assigned has already been tried or not, when it is judged that the test pattern cannot be obtained at the step (4);

(6) assigning the different logic value to said latest logic line, deriving other signal lines whose logic values are uniquely determinable from an assignment of said different logic value to said latest signal line, and returning to the step (4), when it is judged that the assignment of the different logic value has not been tried at the step (5); and (7) resetting a logic value of said latest signal line to variable value, propagating an influence of the resetting to all remaining signal lines, and returning to the step (5), when it is judged that the assignment of the different logic value has already been tried at the step (5).

3. The method of claim 2, wherein at the step (3), the prescribed signal line is the primary input.

4. A method for generating a test pattern for a logic circuit given by primary input logic values for which at least one of primary outputs can observe a fault signal which takes different logic values depending on a presence or absence of a fault, comprising the sequential steps of:

(1) obtaining one signal line within the logic circuit and one logic level that can possibly be required to said one signal line in order to produce the fault signal at a location of the fault, or to control a logic value of said one signal line, or else to propagate the fault signal to an output of a logic block having the fault signal as its input;

(2) Judging whether it is possible for the fault signal to reach said one signal line, and returning to the step (1) when it is judged that it is possible for the fault signal to reach said one signal line, or else deriving all other signal lines whose logic values are uniquely determinable from an assignment of said one logic level to said one signal line, when it is judged that it is not possible for the fault signal to reach said one signal line;

(3) judging whether said other signal lines contain a prescribed signal line or not, and returning to the step (1) when it is judged that said other signal lines do not contain the prescribed signal line, or else actually assigning said one logic level to said one signal line and deriving all logic values determinable by an assignment of said one logic level to said one signal line;

(4) judging whether the logic values derived at the step (3) realize a case including a logic value identical to the fault at the location of the fault, or a case including a logic value opposite to that of already assigned logic value, or else a case including identical logic values for all outputs of the logic block having the fault signal as its input;

(5) judging whether the test pattern has been obtained by the logic values derived at the step (3) when it is judged that none of the cases is realized at the step (4), and returning to the step (1) when it is judged that the test pattern has not been obtained by the logic values derived at the step (3), or else setting the logic values derived at the step (3) as the primary input logic values giving the test pattern;

(6) judging whether an assignment of a different logic value to a latest signal line to have the logic value actually assigned has already been tried or not, when it is judged that any of the cases is realized at the step (4);

(7) assigning the different logic value to said latest logic line, deriving other signal lines whose logic values are uniquely determinable from an assignment of said different logic value to said latest signal line, and returning to the step (4), when it is judged that the assignment of the different logic value has not been tried at the step (6); and (8) resetting a logic value of said latest signal line to variable value, propagating an influence of the resetting to all remaining signal lines, and returning to the step (6), when it is judged that the assignment of the different logic value has already been tried at the step (6).

5. The method of claim 4, wherein at the step (3), the prescribed signal line is the primary input.

6. A method for generating a test pattern for a logic circuit given by primary input logic values for which at least one of primary outputs can observe a fault signal which takes different logic values depending on a presence or absence of a fault, comprising the sequential steps of:

(0) obtaining a set of signal lines to which logic values can be assigned independently from each other among signal lines of the logic circuit;

(1) obtaining one signal line within the logic circuit and one logic level that can possibly be required to said one signal line In order to produce the fault signal at a location of the fault, or to control a logic value of said one signal line by the signal lines of the set obtained at the step (0), or else to propagate the fault signal to an output of a logic block having the fault signal as its input;

(2) judging whether it is possible for the fault signal to reach said one signal line, and returning to the step (1) when it is judged that it is possible for the fault signal to reach said one signal line, or else deriving all other signal lines whose logic values are uniquely determinable from an assignment of said one logic level to said one signal line, when it is judged that it is not possible for the fault signal to reach said one signal line;

(3) judging whether said other signal lines contain the signal lines of the set obtained at the step (0) or not, and returning to the step (1) when it is judged that said other signal lines do not contain the prescribed signal line, or else actually assigning said one logic level to said one signal line and deriving all logic values determinable by an assignment of said one logic level to said one signal line;

(4) judging whether the logic values derived at the step (3) realize a case including a logic value identical to the fault at the location of the fault, or a case including a logic value opposite to that of already assigned logic value, or else a case Including Identical logic values for all outputs of the logic block having the fault signal as its input;

(5) judging whether the test pattern has been obtained by the logic values derived at the step (3) when it is judged that none of the cases is realized at the step (4), and returning to the step (1) when it is judged that the test pattern has not been obtained by the logic values derived at the step (3), or else setting the logic values derived at the step (3) as the primary input logic values giving the test pattern;

(6) judging whether an assignment of a different logic value to a latest signal line to have the logic value actually assigned has already been tried or not, when it is judged that any of the cases is realized at the step (4);

(7) assigning the different logic value to said latest logic line, deriving other signal lines whose logic values are uniquely determinable from an assignment of said different logic value to said latest signal line, and returning to the step (4), when it is judged that the assignment of the different logic value has not been tried at the step (6); and (8) resetting a logic value of said latest signal line to variable value, propagating an influence of the resetting to all remaining signal lines, and returning to the step (6), when It is judged that the assignment of the different logic value has already been tried at the step (6).

7. A system for generating a test pattern for a logic circuit given by primary input logic values for setting a logic value of a specified signal line withing the logic circuit at a specified level, comprising the steps of:

means for checking whether a fault can possibly be propagated to the specified signal line or not:

means for deriving other signal lines whose logic values are uniquely determinable from the specified level of the specified signal line, only when it is judged that the fault cannot possibly be propagated to the specified signal line by the checking means;

means for judging whether the primary inputs are contained among the other signal lines derived by the deriving means; and means for making an assignment of the specified level to the specified signal line, and setting the uniquely determinable logic values for those of the other signal lines which are judged as the primary inputs by the judging means as the primary input logic values giving the test pattern.

* * * * *